(12) United States Patent
Hamilton et al.

(10) Patent No.: US 6,901,010 B1
(45) Date of Patent: May 31, 2005

(54) ERASE METHOD FOR A DUAL BIT MEMORY CELL

(75) Inventors: Darlene G. Hamilton, San Jose, CA (US); Eric M. Ajimine, San Jose, CA (US); Binh Le, San Jose, CA (US); Edward Hsia, Saratoga, CA (US); Ken Tanpairoj, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 185 days.

(21) Appl. No.: 10/119,366

(22) Filed: Apr. 8, 2002

(51) Int. Cl.⁷ .............................................. G11C 7/00
(52) U.S. Cl. ........................ 365/185.22; 365/185.24; 365/185.29; 365/185.33; 365/218
(58) Field of Search ....................... 365/185.22, 185.24, 365/185.29, 185.33

(56) References Cited

U.S. PATENT DOCUMENTS

| | | | | |
|---|---|---|---|---|
| 5,491,809 A | * | 2/1996 | Coffman et al. .............. | 711/103 |
| 6,307,784 B1 | * | 10/2001 | Hamilton et al. ........ | 365/185.22 |
| 6,331,951 B1 | | 12/2001 | Lee et al. | |
| 6,344,994 B1 | * | 2/2002 | Hamilton et al. ........ | 365/185.05 |
| 6,442,074 B1 | * | 8/2002 | Hamilton et al. ........ | 365/185.29 |
| 6,456,533 B1 | * | 9/2002 | Hamilton et al. ........ | 365/185.22 |
| 6,493,266 B1 | * | 12/2002 | Yachareni et al. ....... | 365/185.22 |
| 6,512,701 B1 | * | 1/2003 | Hamilton et al. ........ | 365/185.29 |
| 6,567,303 B1 | * | 5/2003 | Hamilton et al. ........ | 365/185.03 |
| 6,590,811 B1 | * | 7/2003 | Hamilton et al. ........ | 365/185.22 |
| 2002/0159293 A1 | * | 10/2002 | Hamilton et al. ........ | 365/185.22 |
| 2003/0021155 A1 | * | 1/2003 | Yachareni et al. ....... | 365/185.22 |

OTHER PUBLICATIONS

Patent Cooperation Treaty (Dana Schalinatus, Officer), International Search Report, pp. 1–3, International Application No. PCT/US 03/04607.

* cited by examiner

Primary Examiner—Viet Q. Nguyen
(74) Attorney, Agent, or Firm—Amin & Turocy, LLP

(57) ABSTRACT

An erase methodology of flash memory cells in a multi-bit memory array with bits disposed in normal and complimentary locations. An erase verify of bits in the normal locations is performed and if a bit in the normal location fails and if the maximum erase pulse count has not been reached, erase pulses are applied to both the normal bit and the complimentary bit. An erase verify of bits in the complimentary locations is performed and if a bit in the complimentary location fails and if the maximum erase pulse count has not been reached, erase pulses are applied to both the complimentary and the normal bit locations. If the bits pass the erase verify, the bits are subjected to a soft programming verify. If the bits are overerased and if the soft programming pulse count has not been reached a soft programming pulse is applied to the overerased bit.

5 Claims, 4 Drawing Sheets

ERASE METHOD FOR A DUAL BIT MEMORY CELL

TECHNICAL FIELD

This invention relates generally to flash memory devices and in particular to flash memory devices having multi-bit flash memory cells. Even more particularly, this invention relates to an improved method of erasing, verifying erasure and overerase correction of the multi-bits.

BACKGROUND ART

Flash memory is a type of electronic memory media that can be rewritten which can hold its contents without the consumption of power. Flash memory devices are designed to have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in place. Flash memory devices are less expensive and denser. This new category of EEPROMs has emerged as an important non-volatile memory that combines the advantages of erasable programmable read only memory (EPROM) density with EEPREOM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cells in a typical NOR configuration. In addition, the drain regions of the cells are connected together by a conductive bitline. The channel of the cell conducts current between the source and the drain in accordance with an electric field developed in the channel by the stacked gate structure. In the NOR configuration, each drain terminal of transistors within a single column is connected to the same bitline. In addition, each flash cell has its stacked gate terminal connected to a different wordline, while all the flash cells in the array have their source terminals connected to a common source terminal. In operation, individual flash cells are addressed via the respective bitline and wordline using peripheral decoder and control circuitry for programming (writing), reading or erasing function.

Such a single bit stacked gate flash memory cell is programmed by applying a voltage to the control gate and connecting the source to ground and the drain to a predetermined potential above the source. A resulting high electric field across the tunnel oxide leads to a phenomenon called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons causes the cell to be programmed.

In order to erase a typical single bit stacked gate flash memory cell, a voltage is applied to the source and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region. The electrons are then extracted from the floating gate and into the source region by way of Fowler-Nordheim tunneling through the tunnel oxide. As the electrons are removed from the floating gate, the cell is erased.

In conventional single bit flash memory devices, erase verification is performed to determine whether each cell in a block or set of such cells has been properly erased. Current single bit erase verification methodologies provide for verification of bit or cell erasure, and application of supplemental erase pulses to individual cells that fail the initial verification. Thereafter, the erased status of the cell is again verified and the process continues until the cell or bit is successfully erased or the cell is marked as unusable.

Recently, dual bit flash memory cells have been introduced that allow the storage of two bits of information in a single memory cell. The conventional programming and erase verification methods employed with single bit stacked gate architectures are not adequate for such dual bit devices. The dual bit flash memory structures that have been introduced do not utilize a floating gate, such as an ONO flash memory device that employs a polysilicon layer over the ONO layer for providing wordline connections. Conventional techniques do not address the characteristics associated with these types of devices.

Therefore, there is an unmet need in the art for new and improved programming methods, improved erase verification methods, improved overerase correction methods and systems that ensure proper programming and erasure of data bits in a dual bit memory architecture and which account for the structural characteristics thereof

SUMMARY OF THE INVENTION

According to the present invention, the foregoing and other objects and advantages are obtained by a method of erasing and soft programming of the normal and complimentary bits of the dual bit memory device.

In accordance with an aspect of the invention, after a sector of multi-bit memory cells is erased, an erase verify of bits in a normal location is performed and when a bit in the normal location fails and if the maximum erase pulse count has not been exceeded erase pulses are applied to both the normal bit location and the complimentary bit location. An erase verify of bits in a complimentary bit location is performed and when a bit in the complimentary location fails and if the maximum erase pulse count has not been exceeded erase pulses are applied to both the complimentary bit location and the normal bit location.

In accordance with another aspect of the invention, a soft program verify of the multi-bits in the sector of the array is performed and for the bits that fail the soft programming verify a soft programming pulse is applied to the bit if the maximum number of soft programming pulses has not been reached.

The described method thus provides an erase methodology and overerase correction for a multi-bit flash memory device.

The present invention is better understood upon consideration of the detailed description below, in conjunction with the accompanying drawings. As will become readily apparent to those skilled in the art from the following description, there is shown and described an embodiments of this invention simply by way of illustration of the best mode to carry out the invention. As will be realized, the invention is capable of other embodiments and its several details are capable of modifications in various obvious aspects, all without departing from the scope of the invention.

Accordingly, the drawings and detailed description will be regarded as illustrative in nature and not as restrictive.

BRIEF DESCRIPTION OF DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

MODE(S) FOR CARRYING OUT THE INVENTION

Figure 1:
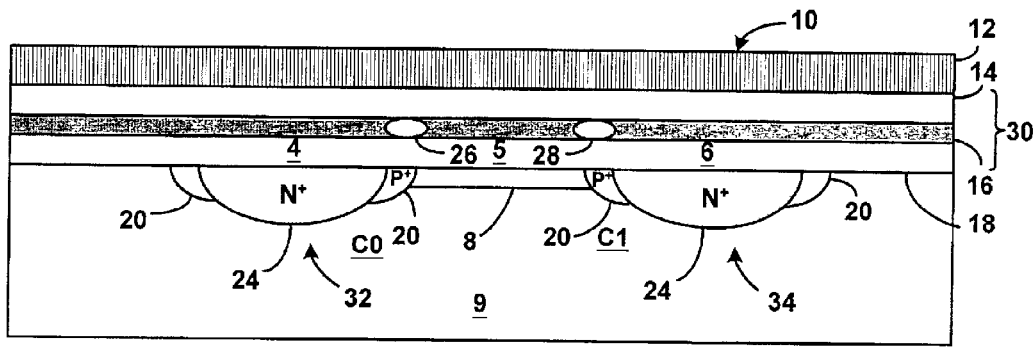
FIG. 1 is a side cross-sectional view of an exemplary dual bit memory cell in which various aspects of the present invention may be implemented.

Reference is now made in detail to a specific embodiment or specific embodiments of the present invention that illustrate the best mode or modes presently contemplated by the inventors for practicing the invention.

The following is a detailed description of the present invention made in conjunction with the attached figures in which like reference numerals refer to like elements throughout. The invention provides methodologies and a system for erasing, verifying erasure, and overerase correction of dual bit memory cells. The present invention may be used in conjunction with a chip erase or a sector erase operation in a flash memory device. Although the invention is hereinafter illustrated and described in association with an ONO (silicon oxide-silicon nitride-silicon oxide) dual bit memory cell architecture, it will be appreciated that the invention is applicable to other type architectures and other dual bit architecture usage schemes.

Referring now to the drawings, FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitlines meet the bottom silicon dioxide layer 18 or along the entire transistor. The boron core implants are more heavily doped than the P-type substrate 9 and assist in control of the VT of the memory cell 10. The cell 10 resides on a P-type substrate 9 with the conductive portion 24 of the bitlines 32 and 34 formed from an $N_+$arsenic implant, such that a channel 8 is formed across the P-type substrate 9. The memory cell 10 is a single transistor having interchangeable source and drain components formed from the $N_+$arsenic implant portions 24 residing on the P-type substrate region 9 with a gate formed as part of a polysilicon wordline 12.

The silicon nitride layer 16 forms a charge trapping layer. Programming a cell is accomplished by applying appropriate voltages to the bitline acting as the drain terminal, to the gate and grounding the source bitline acting as the source terminal. The voltages generate electrical fields along the channel causing electrons to accelerate and jump from the substrate layer 9 into the layer 16 of nitride, which is known as hot electron injection. Since the electrons gain the most energy at the drain, these electrons become trapped and remain stored in the layer 16 of nitride near the drain. The cell 10 is generally uniform and the drain and source are interchangeable. Since the layer 16 silicon nitride is non-conducting, a first charge 26 can be injected into the nitride 16 near a first end of the central region 5 and a second charge 28 can be injected into the layer 16 of silicon nitride near a second end of the central region 5. Therefore, if the charge does not move there can be two bits per cell instead of one bit per cell.

As previously stated, the first charge 26 can be stored in the layer 16 of silicon nitride at a first end of the central region 5 and the second charge 28 can be stored at the other end of the central region 5 such that two bits can reside per memory cell 10. The dual bit memory cell 10 is symmetrical allowing the drain and the source to be interchangeable. Thus, the first bitline 32 may serve as the drain terminal and the second bitline 34 as the source terminal when programming the left bit C0. Likewise, the second bitline 34 may serve as the drain terminal and the first bitline 32 as the source terminal for programming the right bit C1.

Figure 2:
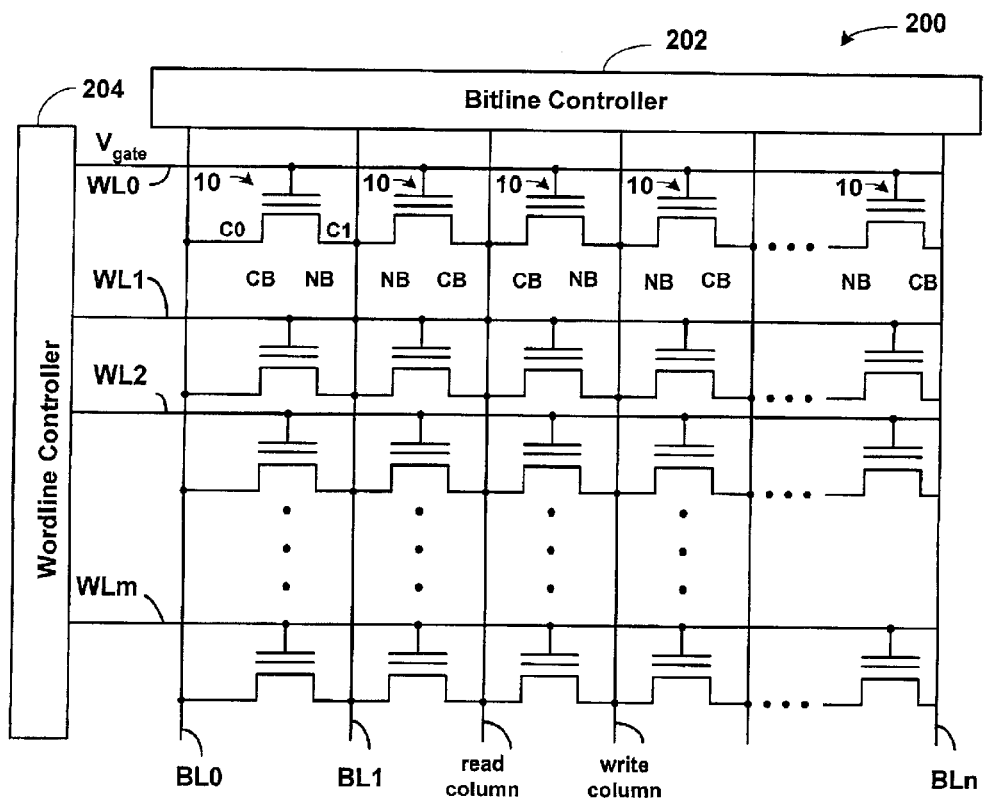
FIG. 2 is a schematic showing the interconnections of a portion of an array.

FIG. 2 and Table 1 illustrates one particular set of voltage parameters for performing reading, programming and one and two sided erases of the dual bit memory cell 10 having the first bit C0 (complimentary bit) and the second bit C1 (normal bit).

TABLE 1

| Operation | Cell | Gate | Bitline 0 | Bitline 1 | Comment |
|---|---|---|---|---|---|
| read | C0 | Vcc | 0 v | 1.2–2 v | complimentary bit |
| read | C1 | Vcc | 1.2–2v | 0 v | normal bit |
| program | C0 | Vpp | 5–6 v | 0 v | hot electron |
| program | C1 | Vpp | 0 v | 5–6 v | hot electron |
| one side-erase | C0 | −6 v | 6 v | 0V | hot hole injection |
| two side-erase | All cells | −6 | 6V | 6 v | hot hole injection |

Figure 3:
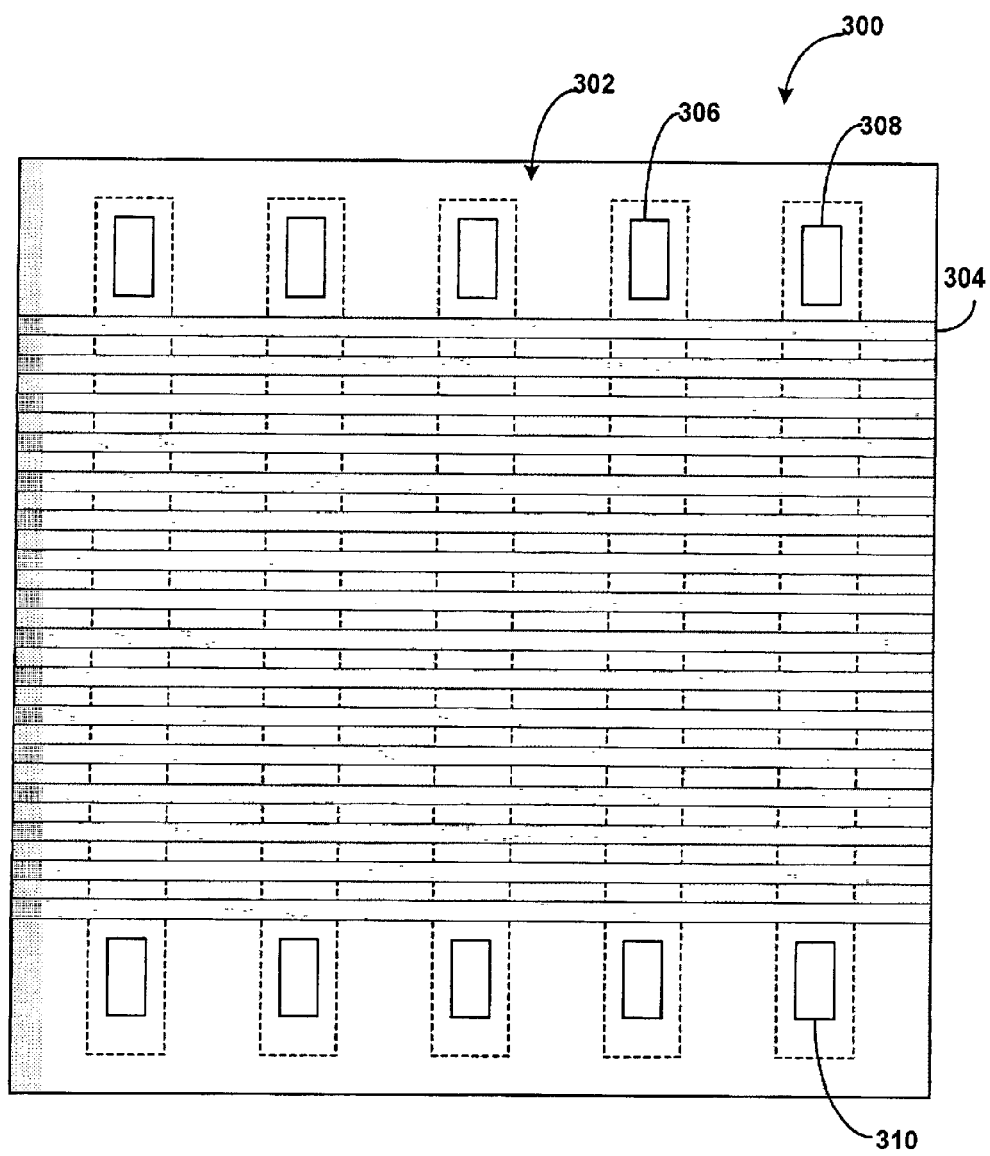
FIG. 3 illustrates a partial top view of a 64K sector of an array of dual bit flash memory having 16 words of 16 bit memory when operating in a dual bit mode.

FIG. 3 illustrates a partial memory cell layout from a top or plan view of an example of a 64K block 300. The present example is illustrated with respect to a 64K block of 8 bit IOs. It should be appreciated that blocks may be 16 bit, 32 bit, 64 bit or more IOs and are not limited to 64K (e.g., 128K, 256 K, etc.). The 64K block 300 can be a sector or a portion of a sector. For example, one or more blocks with the contacts connecting common metal bitlines can form a sector. An ONO stack strip or layer 302 extends the length of the memory array and includes the block 300. The block 300 includes 16 I/Os or groups of columns 310. Each "word" or group of I/Os is comprised of eight transistors or eight normal bits and eight complimentary bits. The eight normal bits are seen by the customer and each I/O includes a polysilicon wordline 304 for addressing the rows of cells. A plurality of bitlines runs underneath the ONO stack strip layer 302 for enabling reading, writing and erasing of individual bits of the memory cells. Each bitline is connected to a first contact 308 and metal bitlines (not shown) at one end of a group of sixteen rows and a second contact 310 at the other end of the group. In the example of FIG. 3, five bitlines are illustrated such that a bitline is tied to an end of every other transistor in a column and two select transistors are used to select between four bits of two transistors for reading, writing and erasing.

Figure 4:
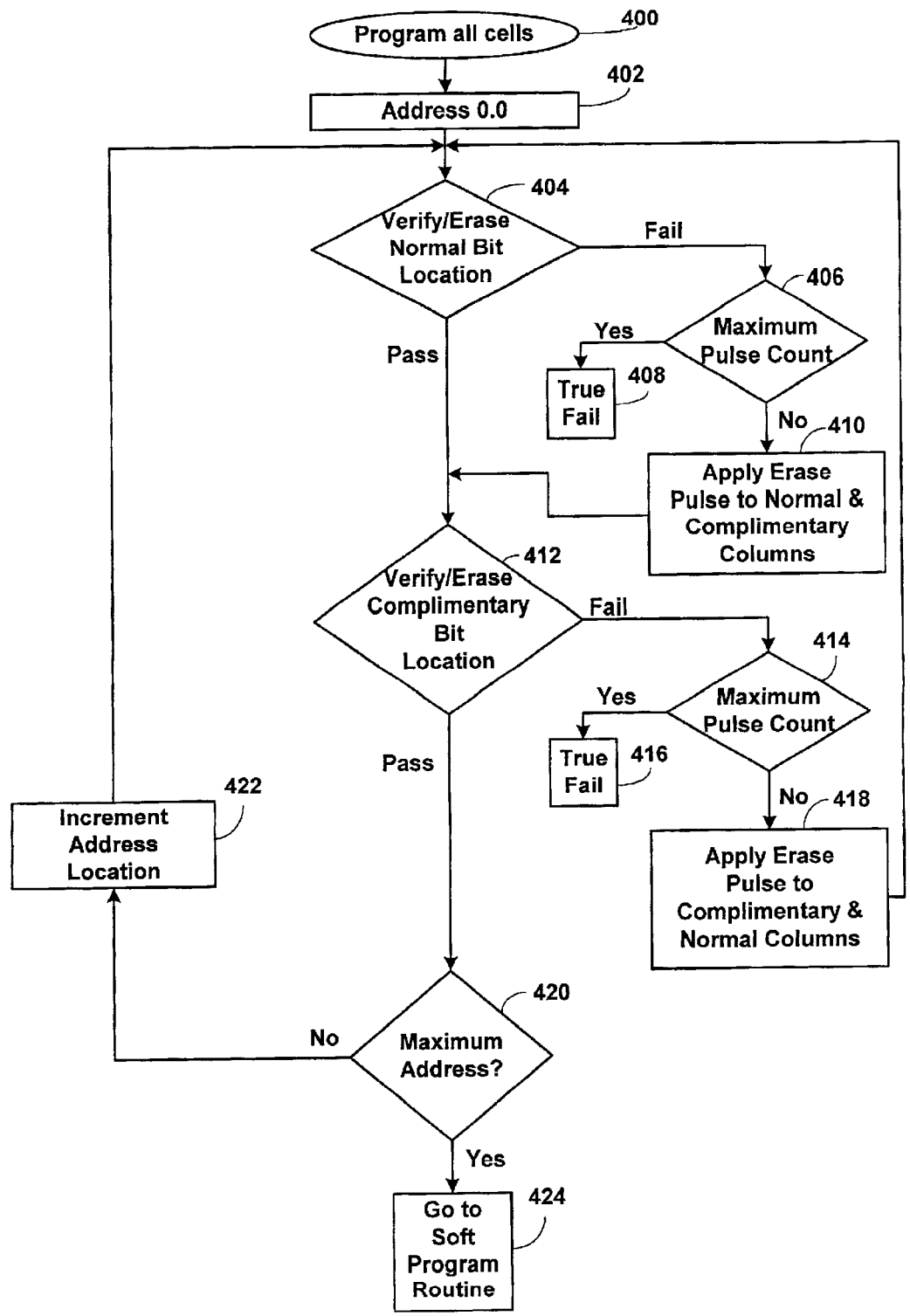
FIG. 4 is a flow diagram illustrating a methodology for erase verifying an array of dual bit memory cells accordance with an aspect of the invention.

FIG. 4 illustrates a particular methodology for performing an erase verifying of dual bit flash memory cells in a sector of a flash memory array. The method begins at step 400 where all cells in the sector are programmed. The method then advances to step 402 where an address counter pointing to the memory address of the array is set to address 0.0. The methodology then proceeds to step 404 where a verify erase of the normal bits in the sector is performed. The bit location can be a memory address of a single bit location or a memory address of an I/O or word location of the sector. If the verify erase of a normal bit location fails, the methodology proceeds to step 406 where it is determined if a maximum pulse count has been exceeded. If the maximum pulse count has been exceeded, a true failure occurs as indicated at 408. If the maximum pulse count has not been exceeded at 406 erase pulses are applied at 410 to both the normal and complimentary columns. The methodology then advances to 412 where a verify erase of the complimentary bit locations in the sector is performed. If the verify erase of a complimentary bit location fails, the methodology proceeds to step 414 where it is determined if a maximum pulse count has been exceeded. If the maximum pulse count has been exceeded, a true failure occurs as indicated at 416.

If the maximum pulse count has not been exceeded at 414 erase pulses are applied to both the complimentary and normal columns at 418 and the methodology returns to step 404 and the methodology repeats.

When both the complimentary bit locations and normal bit locations pass, it is determined at 420 if the maximum address has been reached, if not the address is incremented at 422 and the methodology repeats starting at 404. If the maximum address has been reached, the methodology proceeds to the soft program routine, as indicated at 424.

Figure 5:
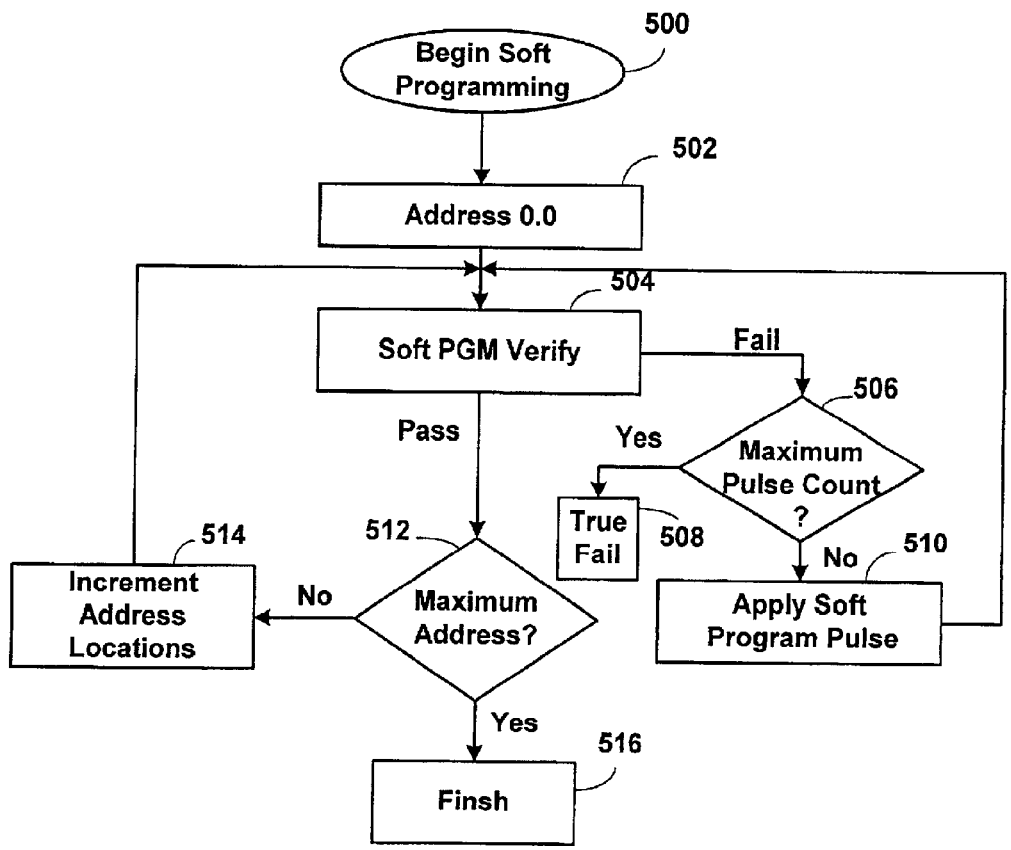
FIG. 5 is a flow diagram illustrating a methodology for soft programming the array after the erase verifying procedure illustrated in FIG. 4.

Referring to FIG. 5, the soft programming routine begins at 500. The address counter is set at 502. A soft program verify is performed at 504 and if there is a failure, it is determined at 506 if the maximum number of soft programming pulses has been applied to the bit. If the maximum number of soft programming pulses has been applied the bit fails as indicated at 508. If the maximum number of soft programming pulses has not been applied a soft program pulse is applied at 510 and the methodology returns to step 504. If the soft program again fails the methodology repeats. If the soft program passes, it is determined at 512 if the maximum address has been reached. If the maximum address has not been reached the address location is incremented at 514 and the methodology returns to step 504 and repeats. If the maximum address has been reached, the procedure is finished as indicated at 516.

In summary, the present invention provides an erase methodology and overerase correction of multi-bit memory cells.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A methodology of erasing flash memory cells in a multi-bit flash memory array with bits in the flash memory cells disposed in normal and complimentary locations, the methodology comprising:

(a) programming all cells in a sector of the multi-bit flash memory array;

(b) setting an address location to an initial setting;

(c) performing an erase verify of a bit in a normal bit location;

(d) if the bit does not verify as erased, determining if a maximum erase pulse count has been reached;

(e) if the maximum erase pulse count has been reached, a failure is indicated and the erase methodology is terminated;

(f) if the maximum pulse count has not been reached applying an erase pulse to the normal and complimentary bit locations;

(g) performing an erase verify of a bit in a complimentary bit location;

(h) if the bit does not verify as erased, determining if the maximum erase pulse count has been reached;

(i) if the maximum erase pulse count has been reached, a failure is indicated and the erase methodology is terminated;

(j) if the maximum pulse count has not been reached applying an erase pulse to complimentary and normal bit locations.

2. The methodology of claim 1 further comprising (k) repeating steps (a)–(j) until the erase verify of the bit in the complimentary bit location in step (g) passes.

3. The methodology of claim 2 further comprising:

(l) determining if a maximum address has been reached;

(m) if the maximum address has been reached, terminating the erase methodology and initiate a soft programming methodology; and (n) if the maximum address has not been reached, incrementing the address location and repeating steps (c)–(n) until the maximum address has been reached.

4. The methodology of claim 3, further comprising:

(m) setting the address location to the initial setting;

(n) performing a soft program verify of the bit identified at the address location;

(o) determining if a maximum soft programming pulse count has been reached if the bit fails the soft program verify of step (n);

(p) if the maximum soft programming pulse count has been reached, a failure is indicated and the erase methodology is terminated;

(q) if the maximum pulse count has not been reached applying a soft programming pulse;

(r) repeating steps (n)–(q) until the bit passes the soft program verify at step (n).

5. The methodology of claim 4 further comprising:

(s) determining if the maximum address has been reached;

(t) if the maximum address has not been reached, incrementing the address location and repeating steps (n)–(r) until the maximum address has been reached; and (u) if the maximum address has been reached, terminating the erase methodology.

* * * * *